United States Patent [19]

Cohen et al.

[11] Patent Number: 4,776,810
[45] Date of Patent: Oct. 11, 1988

[54] SOCKET FOR AN ELECTRONIC COMPONENT

[75] Inventors: Salomon Cohen; Marc Cohen, both of Lausanne, Switzerland

[73] Assignee: CFG S.A., Morges, Switzerland

[21] Appl. No.: 881,223

[22] Filed: Jul. 2, 1986

Related U.S. Application Data

[63] Continuation-in-part of Ser. No. 729,266, May 1, 1985, abandoned.

[30] Foreign Application Priority Data

Feb. 1, 1985 [CH] Switzerland ............................ 475/85

[51] Int. Cl.⁴ ............................................. H01R 13/62
[52] U.S. Cl. ...................................... 439/331; 439/73
[58] Field of Search ............ 339/74 R, 75 M, 75 MP, 339/176 M, 17 CF; 439/70–73, 264, 330, 331, 525–526

[56] References Cited

U.S. PATENT DOCUMENTS

| | | | |
|---|---|---|---|
| 3,409,861 | 11/1968 | Barnes et al. | 339/174 |
| 3,663,920 | 5/1972 | Lapham et al. | 339/17 CF |
| 3,719,917 | 3/1973 | Fischer et al. | 339/17 CF |
| 3,808,582 | 4/1974 | Aldridge et al. | 339/99 R |
| 3,874,768 | 4/1975 | Cutchan | 339/17 CF |
| 3,904,262 | 9/1975 | Cutchan | 339/17 CF |
| 3,907,394 | 9/1975 | Barnes | 439/376 |
| 4,110,917 | 9/1978 | Le Grelle | 339/17 CF |
| 4,204,722 | 5/1980 | Yasui et al. | 339/17 CF |
| 4,252,390 | 2/1981 | Bowling | 339/17 CF |
| 4,390,220 | 6/1983 | Benasutti | 339/17 CF |
| 4,471,408 | 9/1984 | Martinez | 339/17 CF |
| 4,583,806 | 4/1986 | Tainter, Jr. et al. | 339/17 CF |

FOREIGN PATENT DOCUMENTS 2434484 3/1980 France .

OTHER PUBLICATIONS

Machine Design, vol. 47, No. 3, Feb. 6, 1975, p. 41, "Vibration proof Connector Clamps ICs to PCB".

Primary Examiner—J. Patrick McQuade
Attorney, Agent, or Firm—Ladas & Parry

[57] ABSTRACT

The socket is foreseen for fastening and connecting an electronic component with lined-up conducting pins, whereby the free end of the pins is parallel to the main plane of the component, as it is the case for the SMD components. The socket comprises a carrier of insulating material and contact elements maintained in the carrier and positioned each with its first flexible end in the face of a pin for applying a determined contact pressure on that pin when the component is mounted in the socket. The second end of the contact element can be soldered to a conductor in a circuit. The socket comprises further a comb of insulating material with teeth gliding in a guidance of the carrier. Before the insertion of the component into the socket, the teeth of the comb are placed between the contact elements; after the insertion of the component into the socket and an adequate displacement of the comb, each tooth is in the face of a contact element and applies a pressure to the corresponding pin of the mounted component against the contact element.

10 Claims, 4 Drawing Sheets

SOCKET FOR AN ELECTRONIC COMPONENT

This is a continuation-in-part application of Ser. No. 729,266, filed on May 1, 1985, and now abandoned.

BACKGROUND OF THE INVENTION

1. Field of the Invention

This invention concerns fastening and connecting sockets for an electronic component with in-line conducting pins in which the free end of the pins is parallel to the main plane of the component. Electronic components became more complex and presented more connections with the circuit in which they operate. If a component happens to be deficient and one would like to replace it without replacing all the circuit around it, it is necessary to use a socket fastening and connecting the component in a detachable way. As a minimal contact pressure between galvanic surfaces is necessary to ensure a good contact of some duration and as, on the other hand, the components become smaller and smaller, the simultaneous insertion of numerous contact pins into flexible sleeves of a socket becomes problematical.

2. Description of the Prior Art

Devices allowing the insertion of the component without force, so-called zero insertion force or ZIF, developed for components whose connection pins are orthogonal to the main plane of the component.

The devices cannot be used or adapted to the type of component, whose connection pins have their free ends in a plane parallel to the main plane of the component, as is the case, for instance for "surface mounted devices" (SMD).

SUMMARY OF THE INVENTION

It is the purpose of the present invention to solve the insertion problem for SMD components. Therefore, the fastening and connecting socket of the invention is characterized by the fact that it comprises a carrier of insulating material and contact elements maintained in the carrier, crossing it and each positioned in the carrier to contact a pin of the component in order to apply with a first flexible end of the contact element a predetermined contact pressure onto the pin, when the component with its pins is mounted in the socket, and to present its second end in a way allowing to be soldered to a conductor of circuit. It comprises further in a first embodiment a comb of insulating material with teeth, which are narrower than the free space between two adjacent pins of the component and are disposed for corresponding to the contact elements, whereby the back of the comb glides in a gliding guidance of the carrier oriented in the direction of the alignment of the contact elements, whereby before the insertion of the component the comb is in a position where its teeth are between the contact elements and that after reception of the component in the socket and adequate displacement of the comb, each tooth is in the face of a contact element and applies pressure to the corresponding pin of the inserted component against that contact element.

In a second embodiment the further features are the following: Resilient means are attached to the bottom of the carrier; they are able to exert onto the component a force perpendicularly to the main plane of the component in order to press the free ends of the pins of the component against the first ends of the contact elements and are also able to be enough compressed under the action of a force applied onto the component in a direction against the carrier for liberating the free ends of the pins of the component from the first ends of the contact elements, in order to allow a longitudinal displacement of the component in the direction of the alignment of the conducting pins without a noticeable strain being applied onto the pins and/or without a friction remaining between these pins and the first ends (9) of the contact elements (8).

BRIEF DESCRIPTION OF THE DRAWINGS

For a better understanding of the invention embodiments of the socket of the invention will be described as examples, referring to the figures, whereby.

DESCRIPTION OF THE PREFERRED EMBODIMENTS

Figure 1:
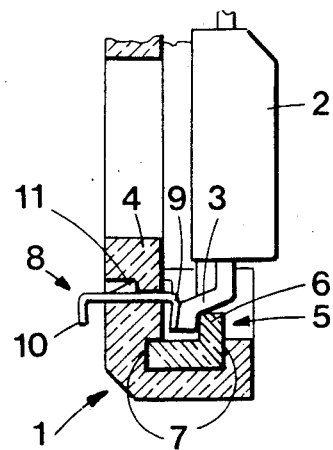
FIG. 1 represents in a first embodiment of the invention a cross section through a socket with a mounted component with one row of pins.
Figure 2:
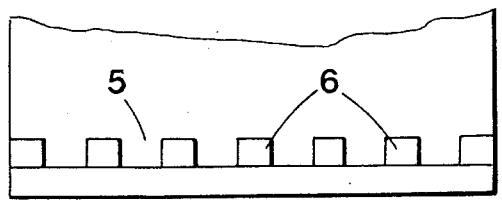
FIG. 2 represents a plan view of the same socket as in FIG. 1, but without the component.

A first embodiment of the socket is for a component with one row of pins; this socket is represented in cross-section at FIG. 1 and in plan view at FIG. 2. The socket 1 and the component 2 can be seen. The component 2 is flat and determines therewith its main plane. The conducting connection pins 3 extend out of the side of the component and after a step shape have their free ends parallel to the main plane of the component. Such a component—named SMD, i.e. Surface Mounted Device—is made for mounting on a flat surface in which its pins are connected to the conductors of a circuit, which are not represented on the figures. The socket comprises a carrier 4 of insulating material and contact elements 8 crossing the carrier and maintained in it, for example by hooks 11. Each contact element 8 is positioned in the carrier to contact a pin of the component, and to apply a predetermined contact pressure onto the pin 3 via first flexible end 9 when the component with its pins is mounted in the socket. The second end 10 of the contact element is parallel to the main plane of the component 1 and can be soldered to a conductor in the flat surface of the circuit (not represented), as would be the case with the ends of the conducting pins 3 of the component 2 if it had been mounted directly in the flat circuit without the socket.

In order to prevent rearward movement of the end of the conducting pin 3 due to the pressure of the flexible end 9 of the contact element, this end of the conducting pin 3 is abutted on a tooth 6 of a comb 5 maintained at its back in a guidance 7 of the carrier 4. The comb can glide over a distance at least equal to half of the pitch between two contact elements 8. The teeth 6 of the comb 5 are narrower than the free space between two adjacent pins 3 of the component.

For the insertion of the component 2 into the socket 1, the teeth 6 of the comb 5 are placed between the contact elements 8. The pins 3 of the component are put onto the flexible ends 9 of the contact elements 8 and the comb 5 is glided over a distance of half a pitch, whereby each tooth 6 becomes an abutment for the corresponding pin 3, on which the contact pressure of the flexible end 9 of a contact element is applied.

Figure 5:
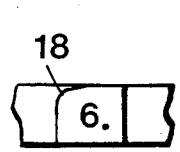
FIG. 5 represents a cross section through a tooth of a comb.

In order to facilitate the gliding displacement of the comb 5 with a reduced lateral force, the tooth edge 18, which comes into contact with the pin 3 of the component 2, is rounded (FIG. 5). Therefore, the contact pressure is progressively built up. This pressure is of approximately 30 gr for each contact. It can now be understood that, but for the lateral friction of the tooth during its gliding, no force is applied to the pins 3 of the component 2 during mounting or removing the component 2 from the socket 1.

Figure 3:
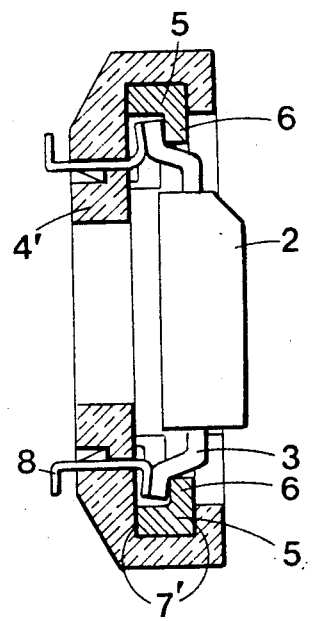
FIG. 3 represents a cross section of a socket for a component with two rows of pins.
Figure 4:
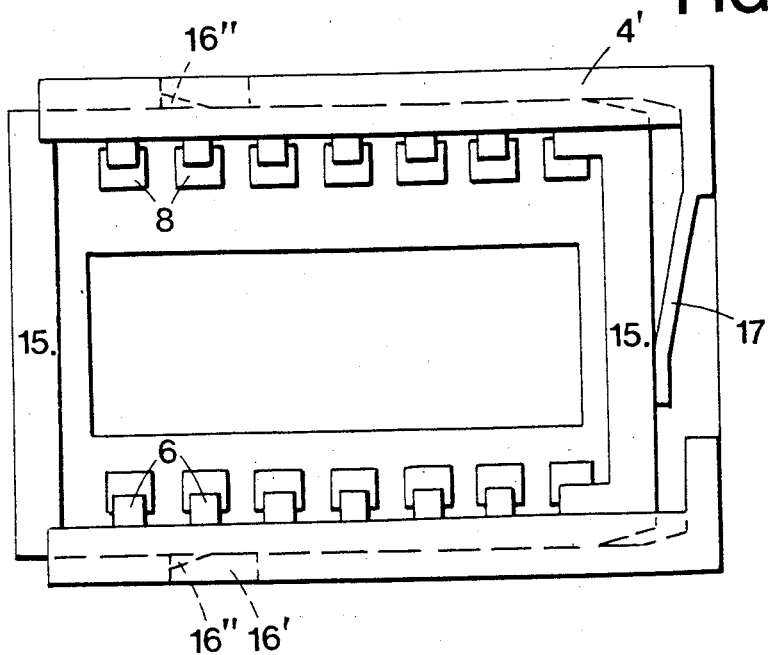
FIG. 4 represents a plan view of the socket of FIG. 3.
Figure 11:
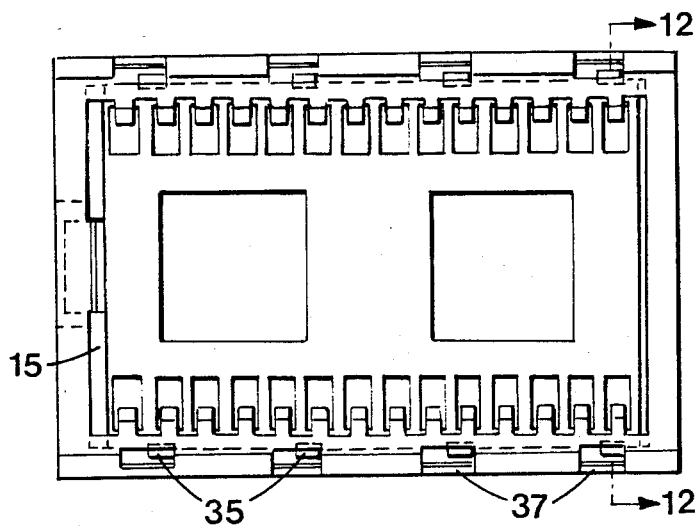
FIG. 11 represents a preferred embodiment of the first embodiment in a plan view.
Figure 12:
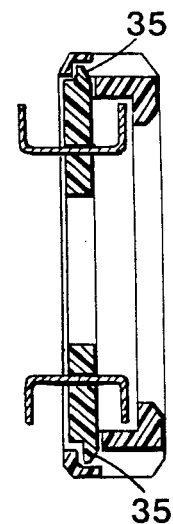
FIG. 12 represents the same embodiment as FIG. 11, but in cross section along line 12—12 of FIG. 11.

The embodiment represented in FIGS. 3 and 4 is similar to the one of FIG. 1 but is provided for components with two parallel rows of conducting pins. Two constructions corresponding each to the embodiment of FIG. 1 are opposed to each other, the carriers 4 being integrated in one piece as well as the combs 5 which constitute together a frame 15 gliding in the integrated carrier 4'. As the guidances 7' are opposed to each other, they can have a simplified form with respect to the form in the first embodiment. In FIG. 11 and 12 a preferred embodiment is provided with short wings 35 of the carrier engaged in corresponding slots 37 at the back of the comb 15, the slots are longer than the wings in order to allow the half pitch displacement of the comb at the insertion of the component. In the represented shape, the wings 35 present an inclined surface over which the comb frame is clipped when it is mounted upon the carrier.

To prevent a displacement of the frame 15 out of the closed position in which the pins 3 of the component 2 are fastened between the contact elements 8 and the teeth 6, engaging means 16' and 16" are provided respectively on the carrier and on the back of the combs 5 of the frame 15 as a recess and as hook, respectively. Additionally, a spring 17 is fixed on the carrier 4' or molded with it applies a maintaining pressure onto the frame 15 in order to prevent its displacement out of its closed position.

The man skilled in the art will be able, without difficulty and within the present invention, to choose other means of maintaining the position of the frame. He can use such means for the embodiment of FIG. 1 described above, too.

A slight recess can be provided at each position in the carrier where a pin of the component must be maintained. This allows, under some circumstances, to diminishing the height of the socket without impairing its strength (Solution not represented on a figure).

Figure 6:
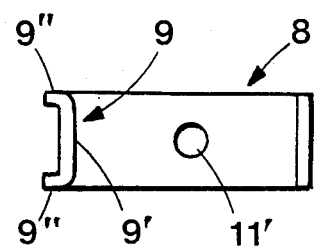
FIG. 6 represents a view of a preferred shape of a contact element.
Figure 13:
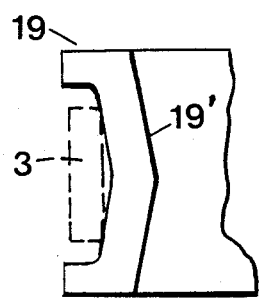
FIG. 13 represents a view of another preferred shape of the contact end of a contact element.
Figure 14:
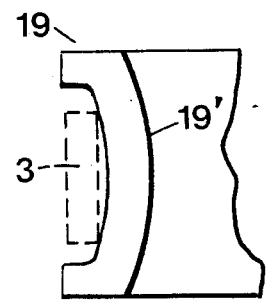
FIG. 14 represents a view of still another preferred shape of the contact end of a contact element.

The flexible end 9 of the contact element 8 can receive a form complementary to the form of the pin 3 with which it shall make contact. For example as shown in FIG. 6, the flexible end 9 of the contact element 8 can have the shape of a U surrounding the three sides of the (not represented) pin of the component. This solution can still be improved as shown in FIG. 13 and 14: the medium portion 19' of the U-shaped flexible end 19 is slightly folded or curved in such a way that only the edges of the flattened component pin 3 are in contact with the U-shaped end 19. In this embodiment specific surface pressure is increased and a more reliable electric contact is provided. The ends 9 or 19 can, of course, be coated in order to improve the electric contact.

The man skilled in the art will be able without further advice combine the preferred features of this embodiment. For example, for a component with pins on four sides, four sockets of FIG. 1 can be combined, whereby the carriers can be made as one piece, individual combs being kept one on each side of the component.

For a lengthy row of connection pins, a unique carrier of the same length as the row to be connected with at least two independent combs can be provided.

When the pins of the component 2 have a centre of symmetry allowing the insertion of the component into the socket following two directions, unsymmetrical means can be provided on the socket in such a way that only one direction for the insertion is operable. These unsymmetrical means can be a hook of the socket engaging an unsymmetrical means of the casing of the component. Such a hook is not represented on the figures because it is well known to the man skilled in the art.

Figure 7:
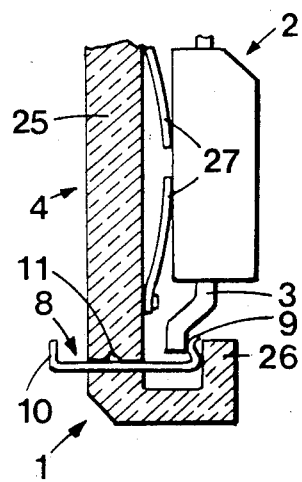
FIG. 7 represents in a second embodiment of the invention a cross section along line 7—7 of FIG. 8 through a socket with a mounted component with one row of pins.

A second embodiment is represented on FIGS. 7 to 10. FIG. 7 shows in cross-section and FIG. 8 in a plan view this embodiment for a component with only one row of pins. The socket 1 carries the component 2, which is flat and determines therewith its main plane.

The conducting pins 3, which have to be connected to the socket, extend laterally from the body of the component and after a step shape have their free end parallel to the main plane of the component. Such a component—called SMD, i.e. surface mounted device—is made for direct application on a flat surface in which its pins are connected to the circuit connections. In FIG. 7 a socket 1 is placed between the free ends of the pins 3 of the component and the connections of a circuit (not shown). This socket 1 comprises a carrier 4 of insulating material and contact elements 8 crossing the carrier and maintained in it, for example by hooks 11. Each contact element 8 is positioned in the face of the carrier to contact a pin of the component, to apply a predetermined contact pressure onto the pin 3 via first flexible end 9 when the component with its pins is mounted in the socket. The second end 10 of the contact element is parallel to the main plane of the component 1 and can be soldered to a conductor in the flat surface of the circuit (not represented), as would be the case with the ends of the conducting pins 3 of the component 2 if it had been mounted directly in the flat circuit without the socket.

Resilient means 27 are attached to the bottom and push the component 2 away from the bottom 25 of the carrier 4 and press herewith the free ends of the pins 3 of the component against the first ends 9 of the contact elements 8.

Figure 8:
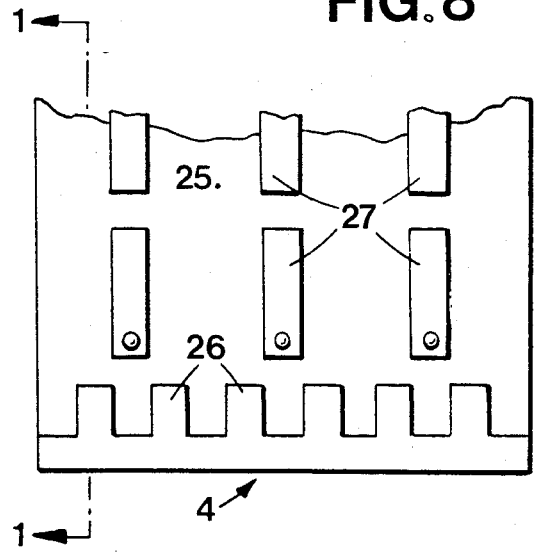
FIG. 8 represents a plan view of the socket of FIG. 7, but without the component.

In order to avoid an excessive recessing of the contact element 8 faced with the pressure of the free end of the conducting pin 3, a part of the contact element gets support—in the preferred embodiment of FIGS. 7 and 8—from a tooth 26 integral with the carrier 4. The open space between two teeth 26 is larger than the width of a pin 3 of the component.

The component 2 is introduced into the socket 1 with a shift of half a pitch, each pin 3 entering between two teeth 26 and the corresponding contact elements 8. The component 2 is pressed against the carrier 4, squashing the resilient means 27 and is shifted longitudinally in the direction of the alignment of the row of pins by half a pitch; there it is released. The resilient means 27 are now pressing the component 2 away from the carrier 4 and the reaction to this force is given by the contact pressure established at each free end of the pins 3 with the first end 9 of the corresponding contact element. This compression is about 30 grammes—one ounce— for each contact. It can be seen that during the longitudinal movement of the component 2, no stress is exerted onto the pins 3 of the component 2 during the mounting or removal of the component 2 on the socket 1. Even if the contact pressure is not completely suppressed, but for example reduced only to 10% of its normal value, the shifting stress on the pins will no longer be significant.

Figure 9:
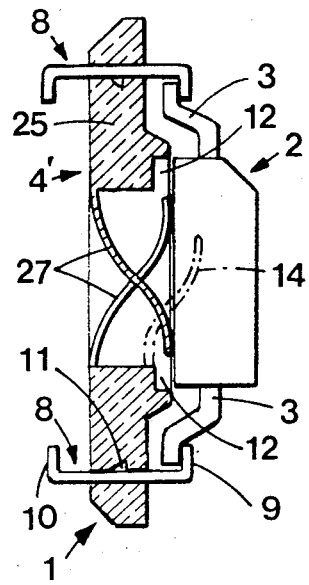
FIG. 9 represents a cross section along line 9—9 of FIG. 10 of a socket for component with two rows of pins in the second embodiment of the invention.
Figure 10:
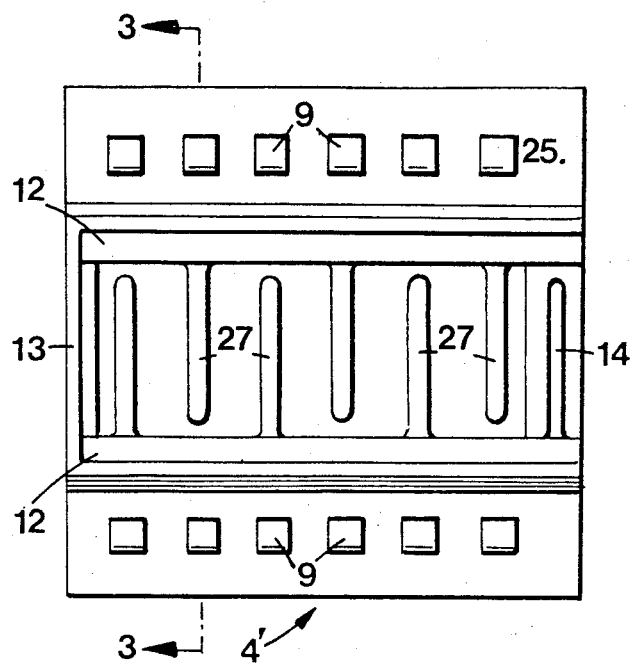
FIG. 10 represents a plan view of the socket of FIG. 9, but without the component.

A preferred execution of this second embodiment of the invention is shown in FIGS. 9 and 10 for component with two parallel and opposed rows of conducting pins. Two constructions, each similar to the one described with FIGS. 7 and 8, are provided, opposed one to the other on a double carrier 4', made out of one piece, which carries two rows of contact elements 8.

In the solution of FIGS. 7 and 8, the teeth 26, which gave an additional support to the first flexible ends 9 of the contact elements 8, are no longer used. The contact elements 8 are now stronger and do not need an additional support. The resilient means 27 are made in the same material as the carrier and f.e. in one piece with it; they are disposed in a way where the force exerted on the component is uniformly distributed over its body. On the bottom 25 of the carrier 4 guiding grooves 12 are provided for lateral guidance of the body of the component 2 when it is pressed against the carrier 4' and displaced longitudinally. In FIG. 9 and 10 longitudinal abutments 13 and 14, the first stationary and second resilient, fasten the component 2 in the correct position with the pins corresponding to the contact elements when it is released, but the abutments also allow the introduction of the component, the resilient abutment 14 being squashed temporarily.

The first ends 9 of the contact elements 8 can also have a shape surrounding the free ends of the pins 3 as explained above for the first embodiment with reference to FIGS. 6, 12 and 13; in the first embodiment the open side of the U was on the side of the flexible end 9 of the contact element 8 which is away from the carrier and in the second embodiment the open side of the U is on the side facing the carrier.

The man skilled in the art can easily and within the scope of the invention choose other shapes for the resilient means, the abutments and the fastening means.

In each embodiment, when the pins of the component 2 present a symmetry which allows the insertion of the component in two different positions, an asymmetrical means can be provided (as it is well known to the men skilled in the art and therefore not represented in the figures) in such a way that only one insert position can be operated. This means can be a hook or an abutment of the socket engaging an asymmetrical features of the body of the component.

As example it was indicated that the contact element 8 crossing the carrier may be maintained in it by hooks 11 (FIGS. 1 and 7). Of course, the contact elements can also be molded in the molding mass and are then preferably provided with a hole 11' (FIG. 6) through which the molding mass will flow and by hardening maintain herewith the contact element.

What is claimed is:

1. A fastening and connecting socket for an electronic component with a body and lined-up conducting pins for the electric connection of the component due to contact with the pins, whereby the free end of the pins is parallel to the main plane of the component, characterized by the fact that it comprises a carrier of insulating material with a bottom, contact elements maintained in the carrier, crossing it and each positioned in the face of the position foreseen for a pin in order to apply with a first flexible end of the contact element a determined contact pressure onto the pin, when the component with its pins is mounted in the socket, and to present its second end in a way allowing it to be soldered to the conductor of a circuit and resilient means attached to the bottom of the carrier, able to exert onto the component a force perpendicularly to the main plane of the component in order to press the free ends of the pins of the component against the first ends of the contact elements and able to be enough compressed under the action of a force applied onto the component in a direction against the carrier for liberating the free ends of the pins of the component from the first ends of the contact elements in order to allow a longitudinal displacement of the component in the direction of the alignment of the conducting pins without a noticeable strain being applied onto the pins and/or without a friction remaining between these pins and the first ends of the contact elements.

2. The fastening and connecting socket of claim 1, characterized by the fact that the carrier includes over each first end of a contact element a tooth from which a portion of the contact element which is near of the first end can get support, at least when the component is mounted in the socket.

3. The fastening and connecting socket of claim 1 or 2, characterized by the fact that the resilient means are made in the same material as the carrier and in one piece with it.

4. The fastening and connecting socket of claim 3, resilient means include several flexible independent blades distributed over the length or the width of the bottom of the carrier in order to exert a force uniformly distributed onto the body of the component.

5. The fastening and connecting socket of claim 4, characterized by the fact that the bottom is provided with a lateral guiding groove for lateral guidance of the component when it is moved longitudinally.

6. The fastening and connecting socket of claim 5 for an electronic component including two parallel and opposed rows of conducting pins, characterized by the fact that the carrier is provided with two corresponding parallel rows of contact elements.

7. The fastening and connecting socket of claim 6, characterized by the fact that the carrier is provided with longitudinal abutments preventing longitudinal movement of the mounted component, when the resilient means press the free ends of the pins of the component against the first ends of the contact elements.

8. The fastening and connecting socket of, claim 7 characterized by the fact that flexible ends of the contact elements has towards the pin the shape of a U, which surrounds on three sides the pin.

9. The fastening and connecting socket of claim 8, characterized by the fact that the medium portion of the U-shaped flexible end is slightly folded or curved in such a way that only the edges of flattened component pins enter in contact with the U-shaped ends.

10. A fastening and connecting socket for an electronic component with a body and lined-up conducting pins for the electric connection of the component due to contact with the pins, whereby the free end of the pins is parallel to the main plane of the component, characterized by a carrier of insulating material and contact elements maintained in the carrier, crossing it and each positioned in the carrier to contact a pin in order to apply with a first flexible end of the contact element a predetermined contact pressure onto the pin, when the component with its pins is mounted in the socket, and to present its second end in a way allowing it to be soldered to a conductor of a circuit that it comprises further a comb of insulating material with teeth, which are narrower than the free space between two adjacent pins of the component and are disposed for corresponding to the contact elements, whereby the back of the comb glides in a gliding guidance of the carrier oriented in the direction of the alignment of the contact elements, whereby before the insertion of the component the comb is in a position where its teeth are between the contact elements and that after reception of the component in the socket and adequate displacement of the comb, each tooth is in the face of a contact element and applies pressure to the corresponding pin of the inserted component against that contact element wherein the gliding guidance between carrier and comb is provided by wings of the carrier engaged in corresponding slots at the back of the comb, the slots being longer than said wings in order to allow the half pitch displacement of the comb at the insertion of the component.

* * * * *